(12) United States Patent
Guinea Trigo et al.

(10) Patent No.: US 9,013,342 B2
(45) Date of Patent: *Apr. 21, 2015

(54) LOW-POWER SIGMA-DELTA CONVERTER

(71) Applicant: STMicroelectronics S.R.L., Agrate Brianza (IT)

(72) Inventors: Jesus Alejandro Guinea Trigo, Brembate (IT); Andrea Baschirotto, Tortona (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/038,427

(22) Filed: Sep. 26, 2013

(65) Prior Publication Data
US 2014/0028483 A1 Jan. 30, 2014

Related U.S. Application Data

(63) Continuation of application No. 13/240,227, filed on Sep. 22, 2011, now Pat. No. 8,547,266.

(30) Foreign Application Priority Data

Sep. 27, 2010 (IT) .............................. VA2010A0071

(51) Int. Cl.
*H03M 3/02* (2006.01)
*H03M 3/00* (2006.01)

(52) U.S. Cl.
CPC .......... *H03M 3/436* (2013.01); *Y10T 29/49002* (2015.01); *H03M 3/45* (2013.01)

(58) Field of Classification Search
CPC ......... H03M 3/424; H03M 3/43; H03M 3/45; H03M 3/452; H03M 3/454; H03M 3/456
USPC ........................................................ 341/143
See application file for complete search history.

(56) References Cited

U.S. PATENT DOCUMENTS 7,119,608 B2 * 10/2006 Doerrer ......................... 327/552

(Continued)

OTHER PUBLICATIONS

San et al., "Second-Order ΔΣAD Modulator with Novel Feedforward Architecture," IEEE Midwest Symposium on Circuits and System, Aug. 2007, pp. 148-151.
Gharbiya, A. et al; On the Implementation of Input-Feedforward Delta-Sigma Modulators; IEEE Transactions on Circuits and Systems—II: Express Briefs, vol. 53, No. 6, Jun. 2006.*
Lee, K. et al.; Improved Low-Distortion ΔΣADC Topology; IEEE International Symposium on Circuits and Systems, 2009. ISCAS 2009, May 2009.*

(Continued)

*Primary Examiner* — Howard Williams
(74) *Attorney, Agent, or Firm* — Allen, Dyer, Doppelt, Milbrath & Gilchrist, P.A.

(57) ABSTRACT

A sigma-delta converter may include an input node, a switched capacitor input stage integrating a difference signal between an input signal from the input node and a feedback signal representing an output signal, and a switched capacitor adder coupled downstream from the switched capacitor input stage and generating a sum signal based upon the input signal with a signal generated by the switched capacitor input stage. The sigma-delta converter may include a switched capacitor output stage amplifying the sum signal and generating an analog amplified signal, a quantization stage coupled in cascade to the switched capacitor output stage and generating the output signal as a digital replica of the analog amplified signal, and a circuit generating the feedback signal as an analog replica of the output signal.

14 Claims, 9 Drawing Sheets

(56) References Cited

U.S. PATENT DOCUMENTS

| | | |
|---|---|---|
| 7,554,474 B2 | 6/2009 | Le Guillou |
| 7,796,071 B2 * | 9/2010 | Doerrer .......................... 341/143 |
| 8,217,815 B2 * | 7/2012 | Chen et al. .................... 341/143 |
| 2007/0018865 A1 * | 1/2007 | Chang et al. .................. 341/143 |
| 2008/0062022 A1 * | 3/2008 | Melanson ..................... 341/143 |

OTHER PUBLICATIONS

Picolli et al., "A 1.0 mW, 71 dB SNDR,—1.8dBFS Input Swing, Fourth-Order $\Sigma\Delta$ Interface Circuit for MEMS Microphones", Sep. 2009, pp. 324-327.

* cited by examiner

LOW-POWER SIGMA-DELTA CONVERTER

FIELD OF THE INVENTION

The present disclosure relates to analog-to-digital converters (ADCs) and, more particularly, to low-power sigma-delta converters for detection of seismic signals.

BACKGROUND OF THE INVENTION

Sigma-delta converters are widely used in audio, medical, automotive and transport, entertainment (video gaming), earth-Science (Seismic Signal Detection), and telecommunications applications. Sigma-delta converters are used to quantize an analog input signal to be converted by displacing the quantization noise to a frequency-band spaced away from the band of the signal, such as to be easily filtered out. This results in improvement of the signal-to-noise (SNR) of the digital signal.

The following references include a description on Sigma Delta ADC: "Understanding Delta Sigma Data Converters," Shreier and Temes, by IEEE Publication, John Wiley 2005; "Design of Multi-bit Delta-Sigma A/D Converters" Y. Geerts, M. Steyaert and Willy Sansen; Kluwer Intl Series in Engineering, May 1, 2002; and "On the implementation of Input-feed forward Delta-Sigma Modulators," Amed Gharbiya and D. A. Johns, Univ Toronto, IEEE Transactions CAS II Vol. 53 No. 6, June 2006, IEEE.

A typical second-order architecture of a sigma-delta modulator, shown in FIG. 1, has two integrators and two feedback loops that inject feedback signals into both integrators. From FIG. 1, it may be evident that both integrators have an input with a feedback signal generated by the quantizer that is thusly corrupted by quantization noise.

In the feed forward architecture of a typical sigma-delta modulator shown in FIG. 2, or of a second-order sigma-delta modulator shown in FIG. 3, the input signal to be converted $V_i$ is directly forwarded to the quantizer. This makes the loop-filter H(z) process only the quantization-noise because the direct path into the adder upstream cancels the quantized replica of the input signal $V_i$ on the feedback path. Therefore, for a multi-bit quantizer, the integrator's output swing is small and the power consumption is reduced in respect to the architecture of FIG. 1.

The second-order single-loop feed forward sigma-delta modulator disclosed by Silva et al. (J. Silva, U. Moon, J. Steensgaard and G. C. Temes, "Wideband low-Fig distortion delta-sigma ADC topology," El. Letters, 7 Jun. 2001) is shown in FIG. 4. The relative transfer functions are:

$$P=Q\cdot(-1+z^{-1})\cdot z^{-1}; R=Q\cdot z^{-2}; Y=X+Q\cdot(-1+z^{-1})^2.$$

It should be noted that the useful signal X is not present in nodes P and R, thus the integrators are processing only the quantization-noise ($\epsilon Q$) whose maximum amplitude is about 1.5 times the least significant bit (LSB). This structure may be efficient for multi-bit quantizers, in which the LSB is particularly small.

An alternative feed forward architecture for a sigma-delta converter has been proposed by Nys et al. (O. Nys, K. Henderson, "A 19-Bit Low-Power Multi-bit Sigma-Delta ADC Based on Data Weighted Averaging," JSSC 1997) and is shown in FIG. 5. Also in this case, the equations show that the integrators do not process the useful signal X:

$$P=Q\cdot(-1+z^{-1})\cdot z^{-1}; R=Q\cdot(2+z^{-1})\cdot z^{-1}; Y=X+Q\cdot(1-z^{-1})^2.$$

The advantages of the architecture of FIG. 4 may include that there are only two input branches (which correspond to a lower load for the previous stage) and the use of a single digital-to-analog converter (DAC) for feedback. By contrast, the architecture of FIG. 5 uses three input branches and two DACs. A potentially difficult feature to implement in the last two architectures is the analog-sum just upstream to the quantizer.

An analog adder may be implemented by way of a passive switched capacitor just upstream to the quantizer, as shown in FIG. 6, (A. Rusu, et al., "A Triple-Mode Sigma-Delta Modulator for Multi-Standard Wireless Radio Receivers," An. Integrated Circ. 2006). This approach may provide good power consumption (because a passive structure is adopted), but the numerous branches may cause a SNR reduction and may force the use of a comparator with high sensitivity. Indeed, the analog adder includes an additional load at the input of the quantizer and for this reason, the quantizer comparator has a higher sensitivity to kick-back noise.

According to an alternative approach, an active analog adder is used just upstream the quantizer (L. Picolli, et al., "A 1.0 mW, 71 dB SNDR, −1.8 dBFS Input Swing, Fourth-Order SD Interface Circuit for MEMS Microphones," ESS-CIRC2009), as shown in FIG. 7. This architecture may need an additional amplifier that makes this approach less attractive for low-power applications.

SUMMARY OF THE INVENTION

It may be desirable for an architecture of a second order switched-capacitor sigma-delta converter to have: a low impedance at the quantizer input; a reduced number of branches; a single DAC; and at most two operational amplifiers. An architecture of a second order switched-capacitor sigma-delta converter that may have all the above characteristics is now disclosed.

The above problems may be addressed by the second switched capacitor stage immediately upstream the quantization stage such to be capable of adding the input signal to be converted with the signal generated by the first stage in the cascade and at the same time of amplifying this sum.

This architecture, while exploiting the benefits of maintaining the second switched capacitor stage immediately upstream of the quantization stage, may implement an analog adder function and an amplification, thus avoiding the presence of a load between the output of the second stage in the cascade and the input of the quantization stage.

DETAILED DESCRIPTION OF THE PREFERRED EMBODIMENTS

Figure 8:
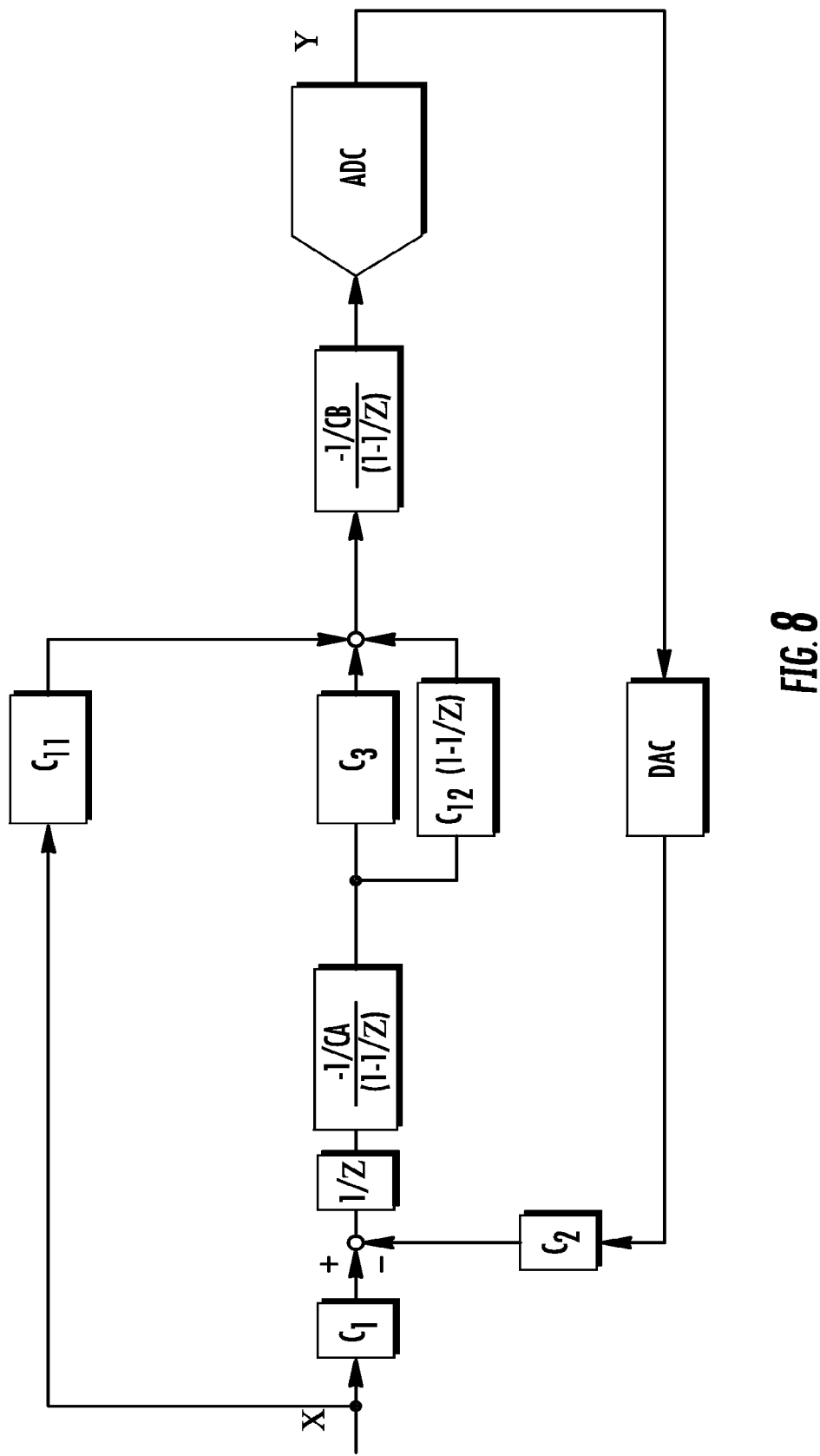
FIG. 8 is a block diagram of a second order sigma-delta converter with a switched capacitor adder between the two integrators of the converter, according to the present invention.

In this description, reference will be made to a single-bit converter, though the same considerations apply similarly for multi-bit configurations, as will be appreciated by those skilled in the art. A block diagram of the architecture of a second order sigma-delta converter in the domain of the Z-transform is depicted in FIG. 8. The numbers 1 and 2 indicate the control signals in phase opposition of the switches, the labels $C_1, C_2, \ldots, C_A$ and $C_B$ indicate the capacitances, ADC indicates an analog-to-digital converter, and DAC indicates a digital-to-analog converter.

Figure 9:
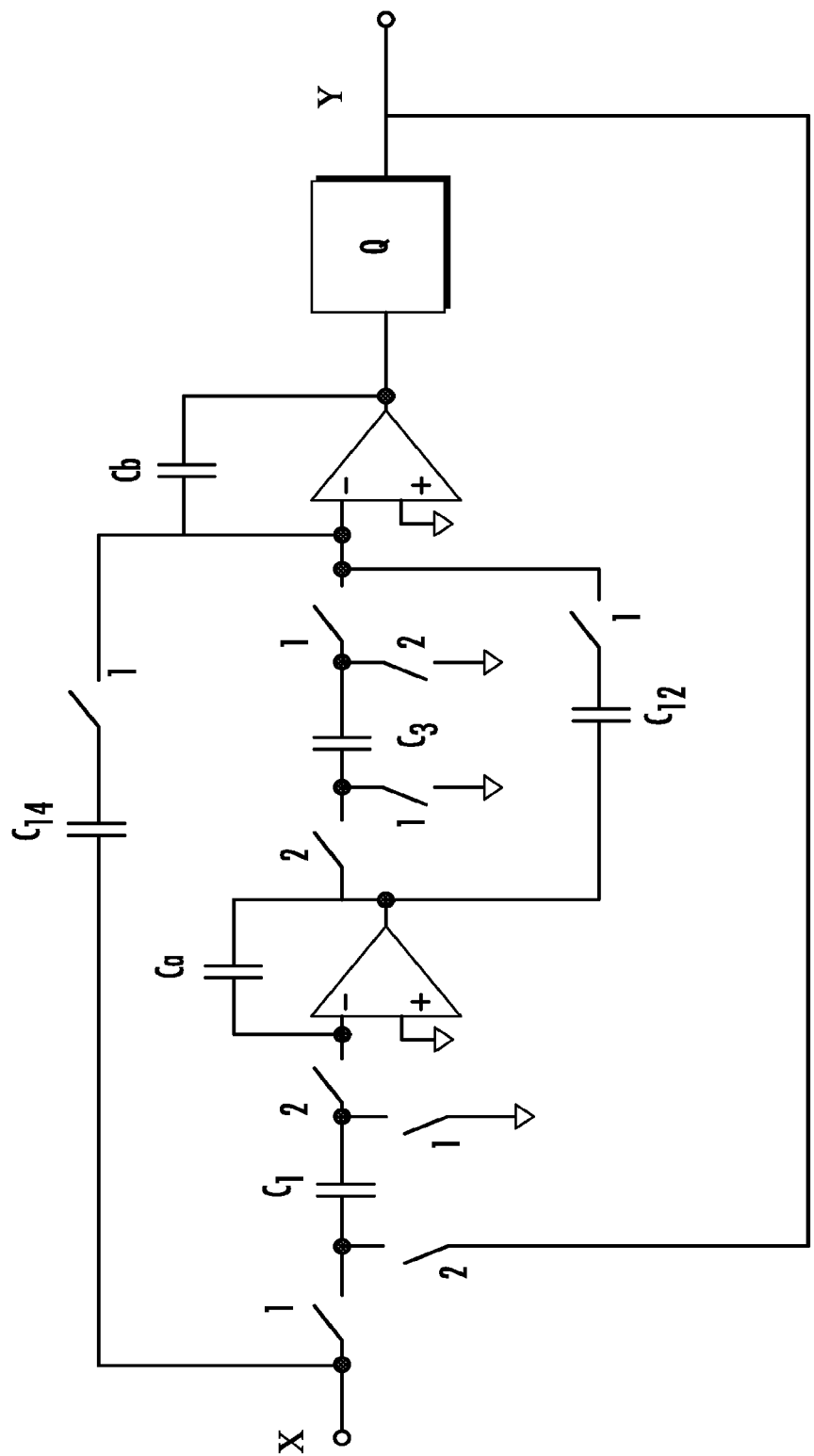
FIG. 9 is an embodiment of the second order sigma-delta converter, according to the present invention.

Another embodiment of the block diagram of FIG. 8 is depicted in FIG. 9. In the circuit embodiment of FIG. 9, there is an output quantizer Q, which produces an analog step output instead of an output ADC. In this case, no DAC is needed in the feedback line. The second stage is characterized by three components (FIG. 9): $C_{11}$ carries the input signal via the switch for ensuring proper phasing. In cases where the sampling frequency is high compared to the frequencies of the signal, the switch may remain closed and provide a direct path. The switched capacitor $C_3$ is coupled between the two stages through the switches controlled by the phases 1 and 2. When the control phase 1 is asserted, the output Y is generated. The circuit also includes a second switched capacitor $C_{12}$, and a series switch at the proper phase is still present in this path to preserve the required stability. The functioning of the circuit will be appreciated by those skilled in the art, and for this reason will not be discussed in detail.

Figure 1:
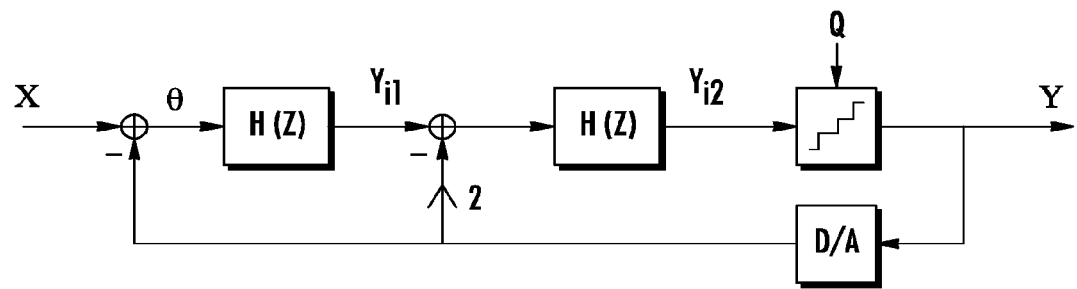
FIG. 1 is a block diagram of a second order sigma-delta converter, according to the prior art.
Figure 2:
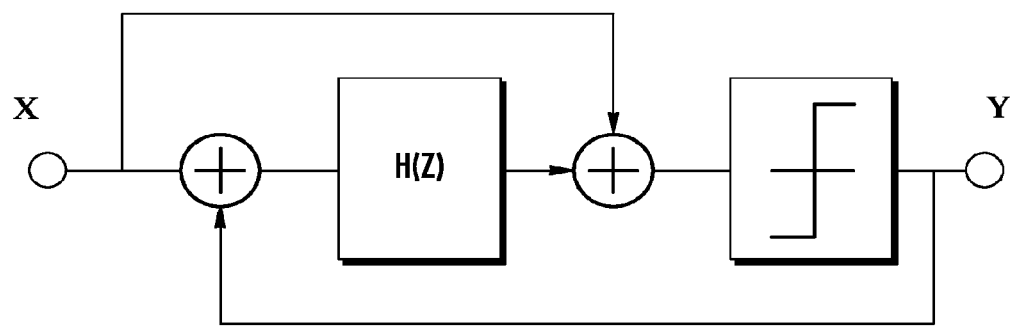
FIG. 2 is a block diagram of a feed forward first order sigma-delta converter, according to the prior art.
Figure 3:
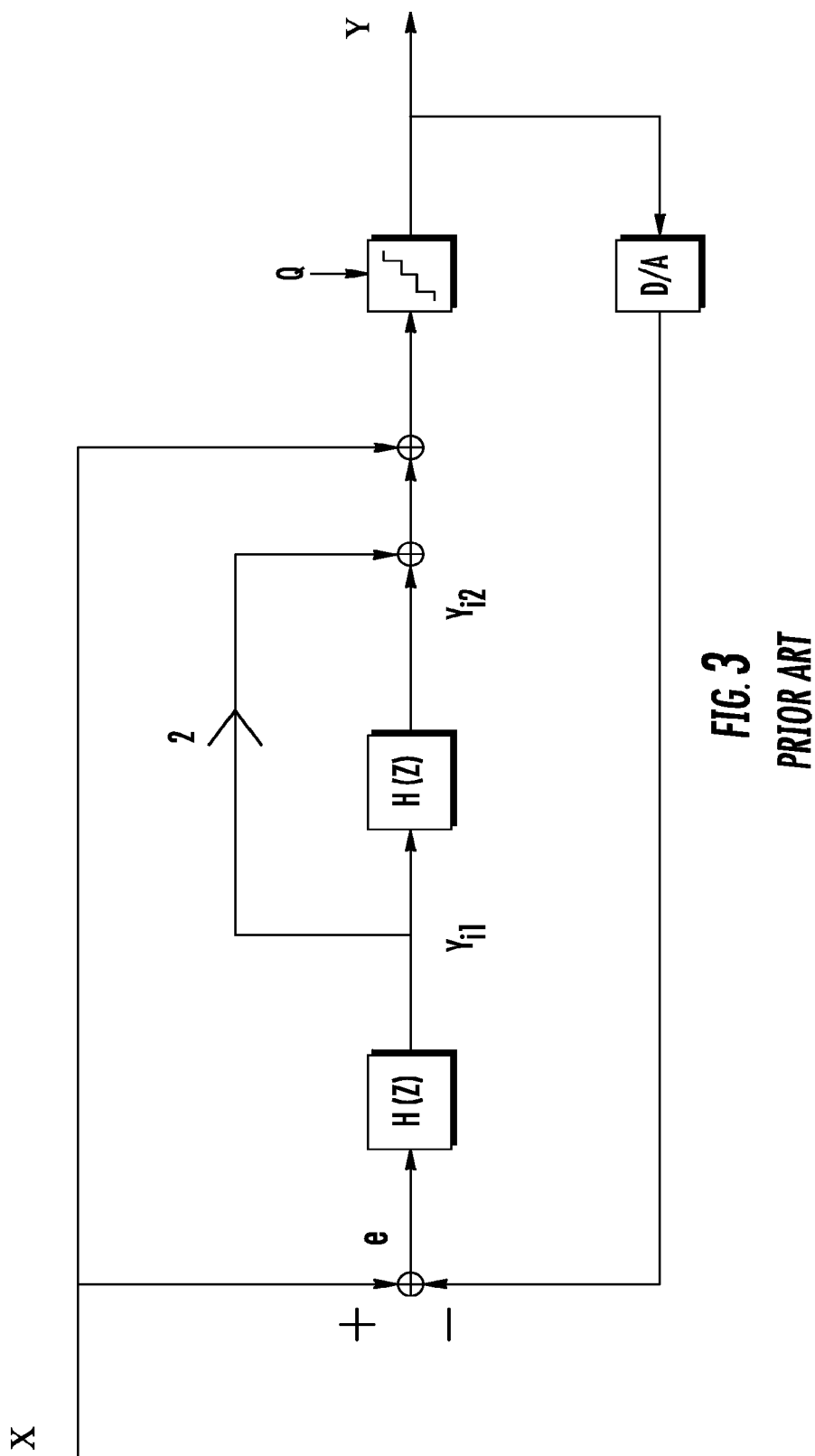
FIG. 3 is a block diagram of a feed forward second order sigma-delta converter, according to the prior art.
Figure 4:
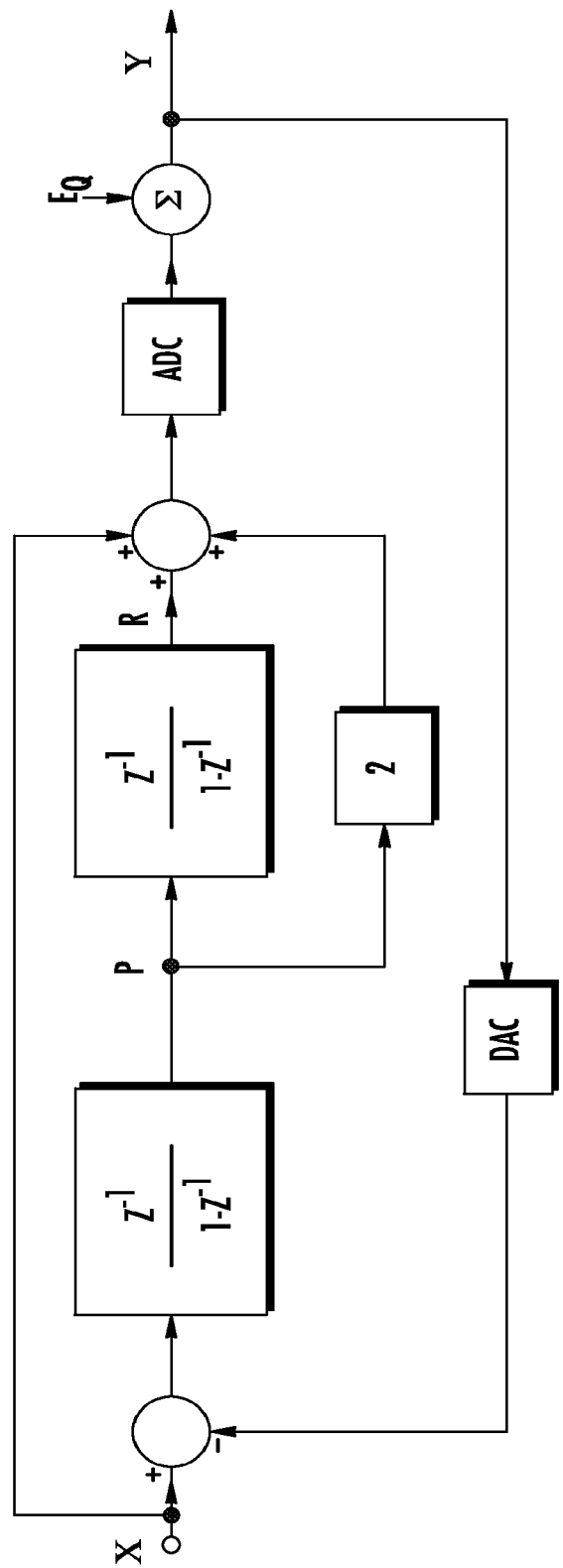
FIGS. 4 and 5 depict two architectures of a second order sigma-delta converter, according to the prior art.
Figure 5:
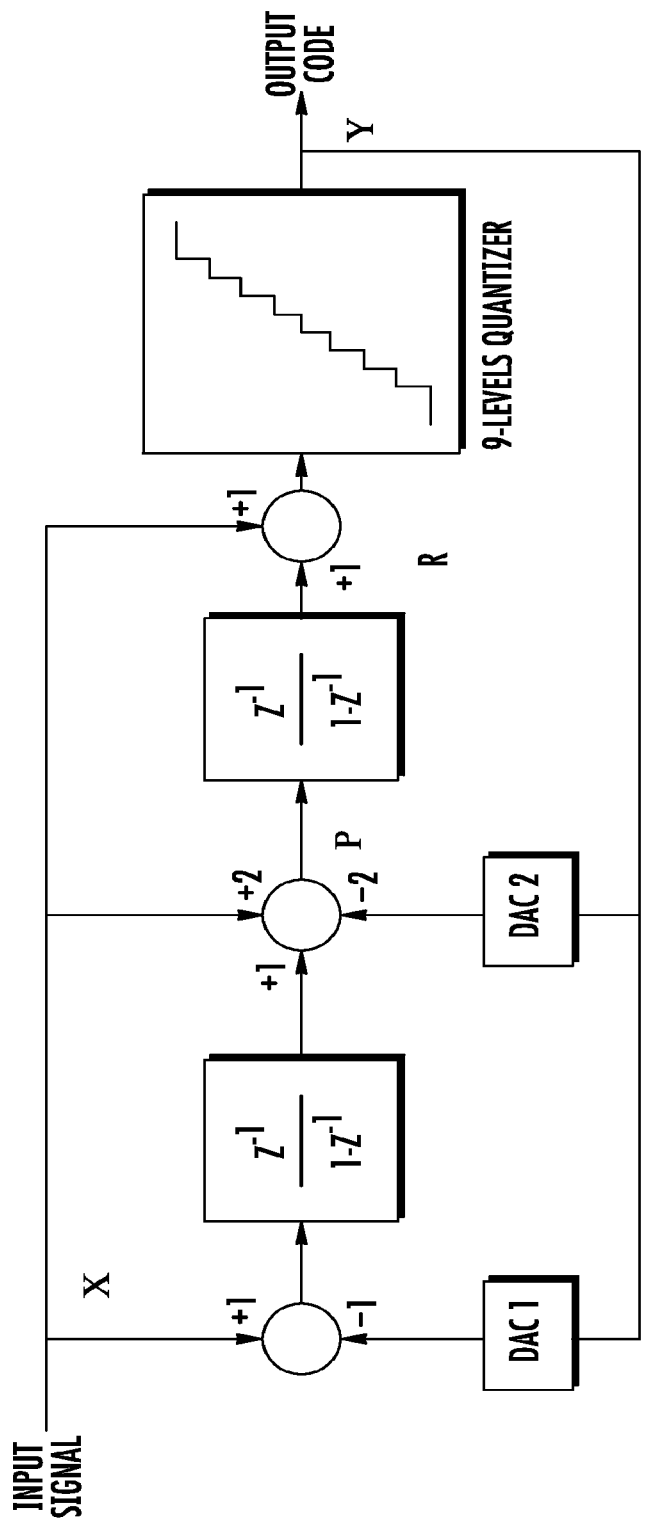
Figure 6:
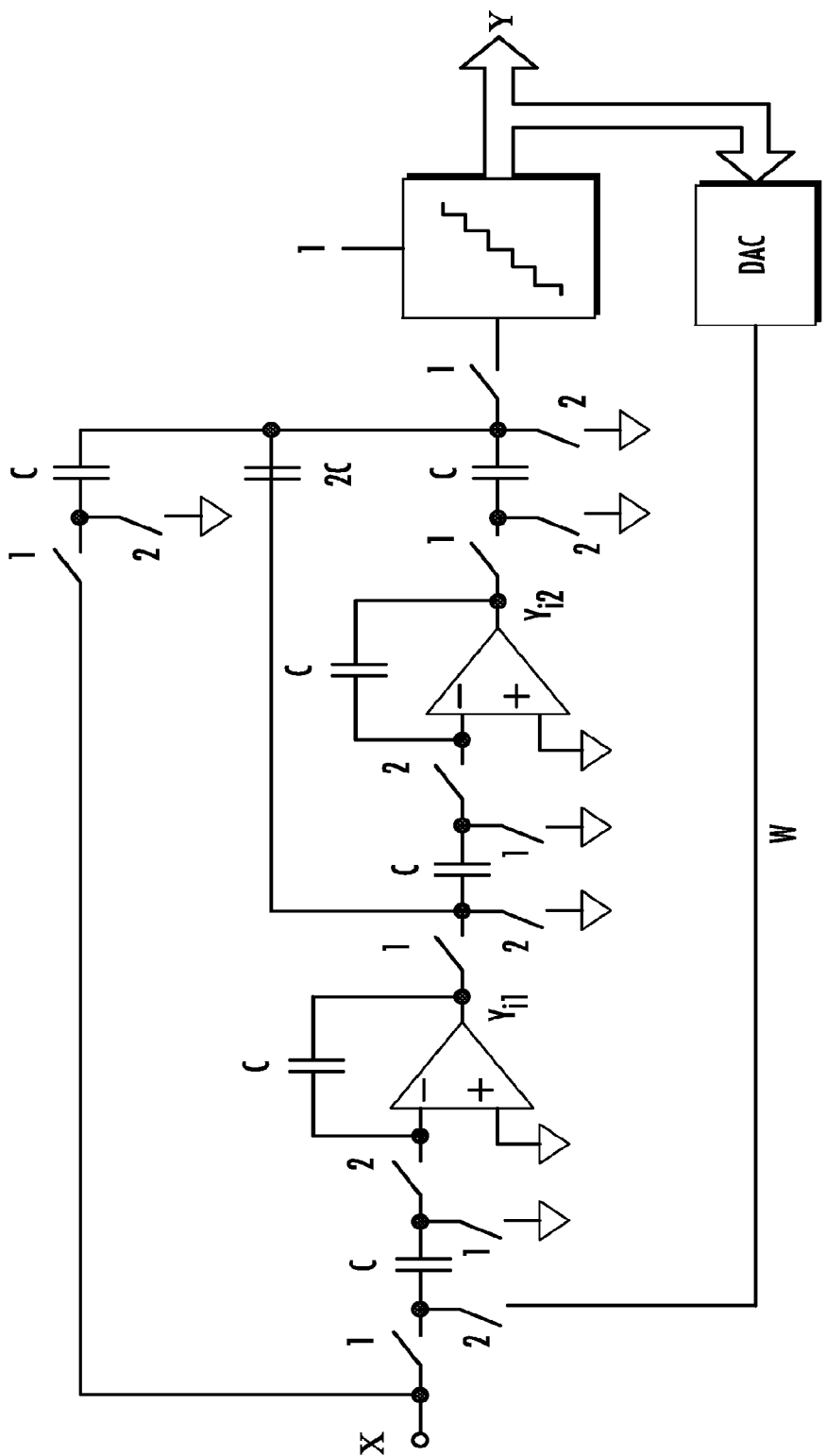
FIG. 6 is an architecture of a second order sigma-delta converter with a switched capacitor adder immediately upstream the quantizer, according to the prior art.
Figure 7:
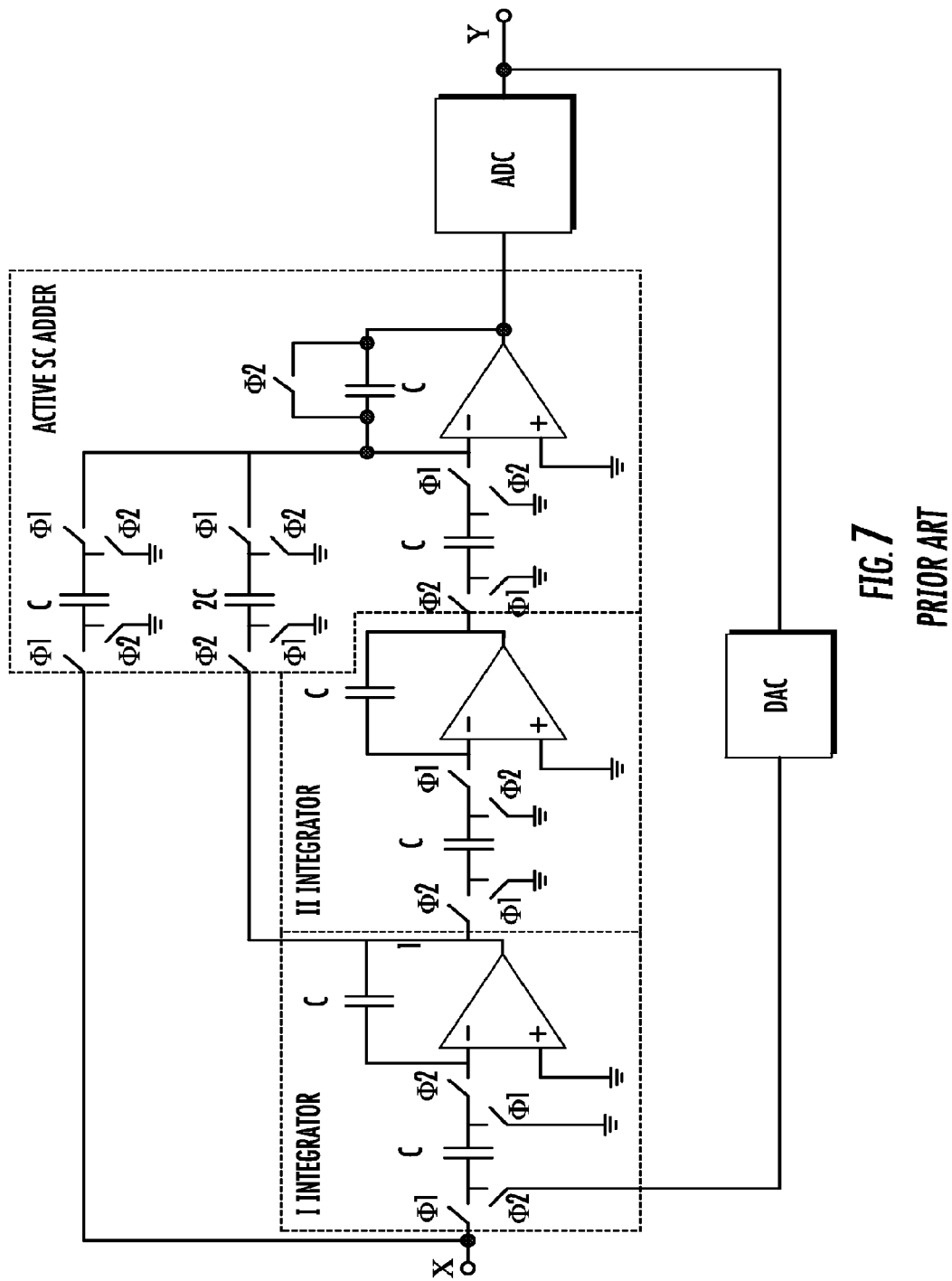
FIG. 7 is another architecture of a second order sigma-delta converter with a switched capacitor adder realized using a third operational amplifier, according to the prior art.

Compared to the typical architectures described above, in the disclosed architecture, the capacitors upstream the second integration stage are connected in order to add together and integrate at the same time the signals provided to the second stage. The architecture does not require extra active components (e.g., operational amplifier), thus it is not affected by the drawbacks of the typical architecture of FIG. 5, and does not need a second feedback path for supplying the output signal to the adder between the two integration stages because of the presence of the capacitor $C_{12}$ switched by the control signal 1.

The feed forward signal may be either directly input to the virtual ground input of the second stage H2, as shown in the figure, or through a switch (not shown) controlled by the control signal 1. The capacitors shown in FIG. 9 may be dimensioned such to make constant the Signal Transfer Function (STF). The loop gain T(z) in the domain of the Z-transform is:

$$T(z) = \frac{-\frac{C_2}{C_A} \cdot z^{-1}}{1 - z^{-1}} \cdot \frac{\frac{C_3}{C_B} \cdot z^{-1} - \frac{C_{12}}{C_B}(1 - z^{-1})}{1 - z^{-1}}. \tag{1}$$

In order to have the following Noise Transfer Function (NTF)

$$NTF = 1 + T(z) = (1 - z^{-1})^2 \tag{2}$$

it may be necessary that $$T(z) = \frac{-2 \cdot z^{-1} + z^{-2}}{(1 - z^{-1})^2} \tag{3}$$

from which $$-\frac{C_2}{C_A C_B}(C_3 + C_{12}) = 1 \tag{4}$$

$$\frac{C_2 C_{12}}{C_A C_B} = -2 \tag{5}$$

and thus $$\frac{C_{12}}{C_3} = -2. \tag{6}$$

The Signal Transfer Function (STF) is $$STF(z) = \frac{-\frac{C_{11}}{C_B} + 2 \cdot z^{-1} \cdot \left(\frac{C_1}{C_A} + \frac{C_{11}}{C_B}\right) - \left(\frac{C_1}{C_A} + \frac{C_{11}}{C_B}\right) \cdot z^{-2}}{(1 - z^{-1})^2}, \tag{7}$$

thus it is possible to make the ratio constant between the STF and the NTF by imposing:

$$\frac{C_1}{C_A} + \frac{C_{11}}{C_B} = 0. \tag{8}$$

This condition is satisfied when the second term has an opposite sign of the first, which in practice is obtained by applying a (−1) gain to the incoming signal. The previous condition is a matching condition between the capacitance ratio input to the first stage and the capacitance ratio input to the second stage.

According to an embodiment, the capacitances $C_1$ and $C_2$ are obtained with a single input capacitor alternatively switched from an input line (in which it plays the role of $C_1$) to a feedback line (in which it plays the role of $C_2$) of the regulator and vice-versa.

Figure 10:
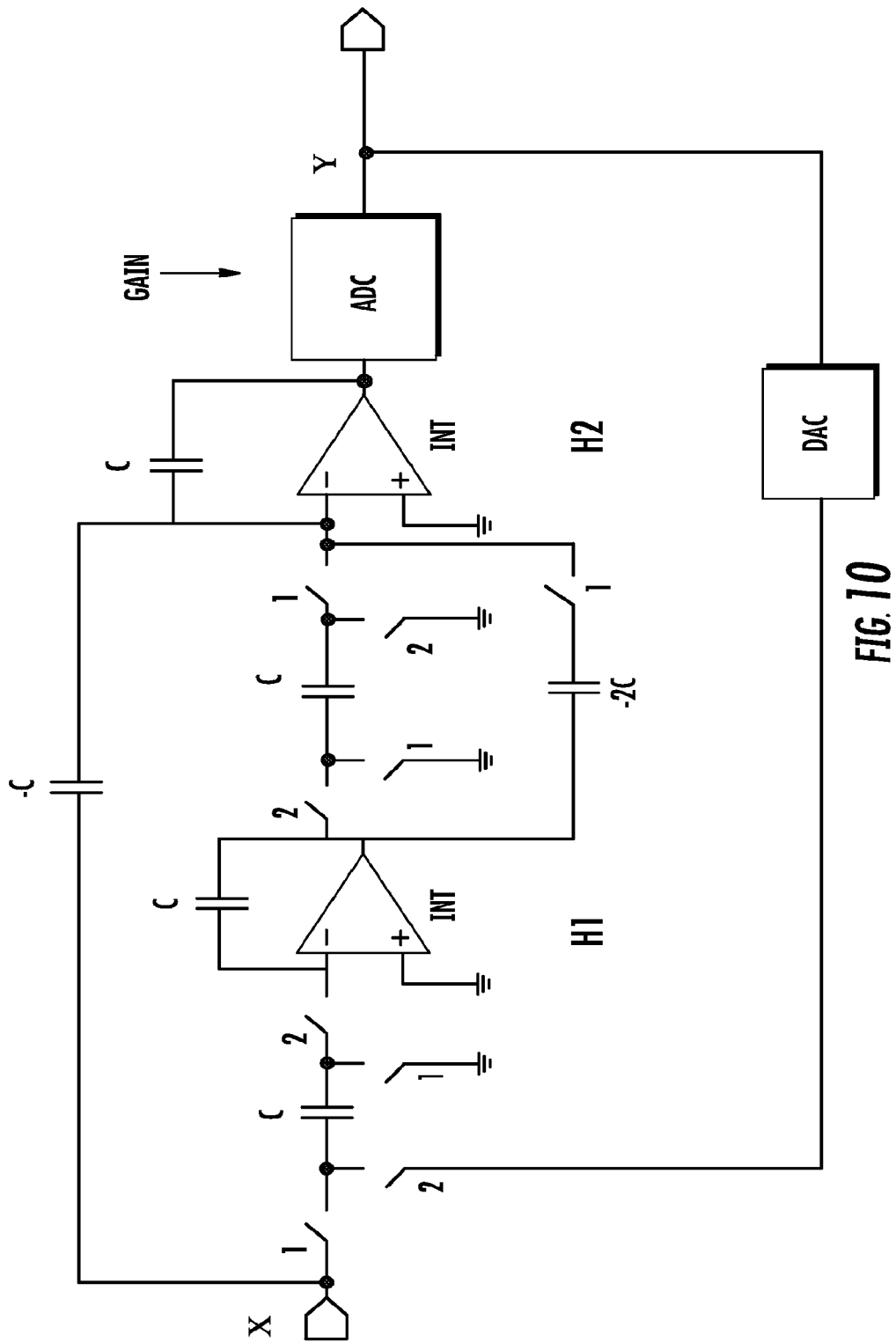
FIG. 10 is yet another embodiment of the architecture of FIG. 9, according to the present invention.

In the embodiment of FIG. 10, this condition is satisfied by imposing:

$C_A = C_B = C_1 = C$;

$C_{11} = -C$;

$C_{12} = -2C$;

$C_3 = C$.

For correct phasing, the −2C path, the feed forward path with a weight −C, and the switched capacitor C all are connected to the integrator H2 when the control phase 1 is asserted. This forces a stable loop configuration by complying with loop delay when connecting the capacitor C at the input of the first stage.

According to yet another embodiment, the capacitors are dimensioned as follows:

$C_3 = C_A = C$;

$C_1 = C/4$;

$C_{11}/C_B = -1;4;$ $C_{12}/C_3 = -2.$

In this case, the gain ¼ of the first stage may be compensated either by imposing $C_B = 4C;$ $C_{11} = -C;$ or by using the following values $C_B = C;$ $C_{11} = -C;$ and at the same time by imposing that the ADC have a gain GAIN equal to 4. In the latter case, equation (5) becomes $$\frac{C_2 C_{12}}{C_A C_B} \cdot GAIN = -2. \quad (9)$$

The circuit may achieve the typical resolution and linearity requirements, and due to the reduced number of capacitors, may minimize power consumption.

According to another aspect, the multi-level quantizer of the ADC may be realized using parallel (flash) comparators with equally spaced threshold levels across the signals dynamic range (DR). ADC and DAC capacitors mismatches may be minimized by trimming the value of the capacitors with a bit scrambling Dynamic Element Matching (DEM).

That which is claimed is:

1. A sigma-delta converter comprising:
   a switched capacitor input stage configured to integrate based upon an input signal and a feedback signal;
   a switched capacitor adder coupled to said switched capacitor input stage;
   a switched capacitor output stage coupled to said switched capacitor adder;
   a quantization stage coupled to said switched capacitor output stage; and
   a feedback circuit configured to generate the feedback signal;
   said switched capacitor adder comprising
      a first plurality of switches,
      a first capacitor alternately coupled through said first plurality of switches between a reference voltage and an input of said switched capacitor output stage, and between an output of said switched capacitor input stage and the reference voltage,
      a second capacitor coupled between the input signal and the input of said switched capacitor output stage when a first control signal is at a first value, and
      a third capacitor coupled between the output of said switched capacitor input stage and the input of said switched capacitor output stage when the first control signal is at the first value.

2. The sigma-delta converter of claim 1 wherein said quantization stage comprises an analog-to-digital converter (ADC); and wherein said feedback circuit comprises a digital-to-analog converter (DAC) coupled to said ADC.

3. The sigma-delta converter of claim 2 further comprising a second plurality of switches, and a fourth capacitor alternately coupled by said second plurality of switches between the input signal and the reference voltage, and between an output of said DAC and an input of said switched capacitor input stage.

4. The sigma-delta converter of claim 3 wherein said first capacitor, said second capacitor, and said fourth capacitor have a same first capacitance value; and wherein said third capacitor has a second capacitance value two times the first capacitance value.

5. The sigma-delta converter of claim 3 wherein said first capacitor and said fourth capacitor have a same first capacitance value; and wherein said third capacitor has a second capacitance value two times the first capacitance value.

6. The sigma-delta converter of claim 5 wherein said switched capacitor output stage comprises a fifth capacitor coupled in feedback.

7. The sigma-delta converter of claim 6 wherein a ratio between a third capacitance value of said second capacitor and a fourth capacitance value of said fifth capacitor is a reciprocal value of a gain value of said feedback circuit.

8. A sigma-delta converter comprising:
   a switched capacitor input stage configured to integrate based upon an input signal and a feedback signal;
   a switched capacitor adder coupled to said switched capacitor input stage;
   a switched capacitor output stage coupled to said switched capacitor adder; and
   a quantization stage coupled to said switched capacitor output stage;
   said switched capacitor adder comprising
      a first plurality of switches,
      a first capacitor alternately coupled through said first plurality of switches between a reference voltage and an input of said switched capacitor output stage, and between an output of said switched capacitor input stage and the reference voltage,
      a second capacitor coupled to an input of said switched capacitor output stage when a first control signal is at a first value, and
      a third capacitor coupled between the output of said switched capacitor input stage and the input of said switched capacitor output stage when the first control signal is at the first value.

9. The sigma-delta converter of claim 8 further comprising a second plurality of switches, and a fourth capacitor alternately coupled by said second plurality of switches between a converter input and the reference voltage, and between an output and an input of said switched capacitor input stage.

10. The sigma-delta converter of claim 9 wherein said first capacitor, said second capacitor, and said fourth capacitor have a same first capacitance value; and wherein said third capacitor has a second capacitance value two times the first capacitance value.

11. The sigma-delta converter of claim 9 wherein said first capacitor and said fourth capacitor have a same first capacitance value; and wherein said third capacitor has a second capacitance value two times the first capacitance value.

12. The sigma-delta converter of claim 11 wherein said switched capacitor output stage comprises a fifth capacitor coupled in feedback.

13. A method of sigma-delta conversion comprising:
   operating a switched capacitor input stage for integrating based upon an input signal and a feedback signal, a switched capacitor adder coupled to said switched capacitor input stage, a switched capacitor output stage coupled to said switched capacitor adder, and a quantization stage coupled to said switched capacitor output stage; and
   wherein operating the switched capacitor adder comprises controlling a first plurality of switches so that a first capacitor alternately coupled between a reference voltage and an input of said switched capacitor output stage, and between an output of said switched capacitor input stage and the reference voltage, coupling a second capacitor between the input signal and the input of said switched capacitor output stage when a first control signal is at a first value, and coupling a third capacitor between the output of said switched capacitor input stage and the input of said switched capacitor output stage when the first control signal is at the first value.

14. The method of claim 13 wherein operating the switched capacitor adder further comprises controlling a second plurality of switches so that a fourth capacitor is alternately coupled between the input signal and the reference voltage, and between an output and an input of said switched capacitor input stage.

* * * * *